United States Patent [19]

Sundby

[11] Patent Number: 5,440,254
[45] Date of Patent: Aug. 8, 1995

[54] ACCURATE LOW VOLTAGE DETECT CIRCUIT

[75] Inventor: James T. Sundby, Tracy, Calif.

[73] Assignee: Exar Corporation, San Jose, Calif.

[21] Appl. No.: 963,867

[22] Filed: Oct. 20, 1992

[51] Int. Cl.$^6$ ............................................. H03K 5/153
[52] U.S. Cl. ...................................................... 327/79
[58] Field of Search ............... 307/491, 494, 354, 358, 307/359, 360, 362; 327/63, 77, 78, 79

[56] References Cited

U.S. PATENT DOCUMENTS

| | | | |
|---|---|---|---|
| 3,725,795 | 4/1973 | Mesnhimer | 307/360 |
| 4,301,380 | 11/1981 | Thomas | 307/362 |
| 5,003,196 | 3/1991 | Kawaguchi | 307/358 X |
| 5,034,728 | 7/1991 | Taylor | 307/358 X |

Primary Examiner—Willis R. Wolfe
Attorney, Agent, or Firm—Townsend and Townsend Khourie and Crew

[57] ABSTRACT

An accurate and stable low voltage detect circuit that provides a low voltage detect signal with minimal variation over process and temperature without trimming requirements. The power supply voltage is divided by a resistor voltage divider and compared to the output voltage of a bandgap reference circuit at the inputs of a comparator. The output of the comparator indicates power-on when the voltage divided power supply raises above the bandgap reference voltage. The low voltage detect circuit of the present invention will generate a correct low voltage detect signal even at power supply voltages too low for much of the rest of the circuit to operate properly. At low enough Vcc voltages, a transistor switch disconnects the resistor voltage divider from Vcc, causing all voltages taps off of the resistor voltage divider to drop to ground. Additionally, especially designed bandgap reference and comparator circuits ensure proper operation of the low voltage detect circuit at low power supply voltages.

11 Claims, 4 Drawing Sheets 5,440,254

ACCURATE LOW VOLTAGE DETECT CIRCUIT

BACKGROUND OF THE INVENTION

When power supply voltage is first connected to a circuit, the initial state of the circuit is unknown. Low voltage detect circuits are used to detect the voltage at the power supply terminal, and reset the initial state of the circuit once that voltage crosses a predetermined turn-on point.

One approach to the design of low voltage detect circuits relies on the turn-on voltage of a transistor (Vbe in the case of bipolar, or Vt in the case of MOS transistors) to define the turn-on point. These circuits are therefore sensitive to the absolute value of a threshold voltage (or Vbe) as well as the temperature coefficient of the threshold voltage (or Vbe). To improve their accuracy, the variation in the absolute value is corrected at die sort using trimming techniques. However, temperature sensitivity of these circuits will still cause variations in the turn-on point. This can be a problem, especially when there is a narrow window between the minimum power supply voltage the circuit might receive and the maximum power supply voltage the circuit might require for proper operation.

Another approach to the design of low voltage detect circuits uses a capacitor to hold a node voltage until the power supply voltage is high enough to turn on a switch that discharges the capacitor. This approach, however, requires a fast power supply voltage rise time. In the case of a slow rising power supply voltage, leakage could reduce the charge on the capacitor to low enough levels to signal power-on, before the power supply voltage has reached the turn-on point.

Therefore, existing low voltage detect circuits do not satisfy the requirements of a fast and accurate low voltage detect signal that has very little variation over process and temperature.

SUMMARY OF THE INVENTION

The low voltage detect circuit of the present invention uses a reference voltage that remains relatively constant over process and temperature, such as a reference voltage generated by a bandgap reference circuit. A resistor voltage divider divides the power supply voltage and applies the divided power supply voltage to one input of a comparator. The comparator compares this voltage to the reference voltage and indicates power-on at its output when the voltage divided power supply raises above the bandgap reference voltage. In addition to improved temperature performance, the low voltage detect circuit of the present invention does not require trimming which reduces the cost at die sort.

Because at low enough power supply (Vcc) voltages the bandgap and the comparator may not operate properly, the low voltage detect circuit of the present invention also includes several features that ensure against faulty power-on detection at lower Vcc voltages. Accordingly, in one embodiment, the resistor voltage divider connects to Vcc through a transistor switch. The control terminal of this transistor switch connects to a biasing circuit powered by Vcc, so that at low enough Vcc voltages the switch is turned off. This will cause the divided power supply voltage to drop down to ground, to ensure the lowest possible voltage appears at the input of the comparator as compared to the reference voltage.

To guarantee against faulty power detection, the bandgap reference and the comparator are designed such that a disable signal, that is tapped off the resistor voltage divider, will force the output of the bandgap reference to pull as high as Vcc and will assist in pulling down the comparator output. The Vcc level at which the disable signal turns high can be set by appropriate ratioing of resistors.

Yet another feature of the low voltage detect of the present invention provides for hysteresis on the power-on trip point for a stable and consistent operation. This is accomplished using feedback from an inverting output of the comparator to control a transistor switch which can short out a resistor in the resistor divider chain. This will cause the voltage taps off the resistor divider to rise once low voltage detect signal comes on, lowering the turn-off trip point as compared to the turn-on trip point.

A further understanding of the present invention may be had with reference to the description and diagrams below.

DESCRIPTION OF THE PREFERRED EMBODIMENT

Figure 1A:
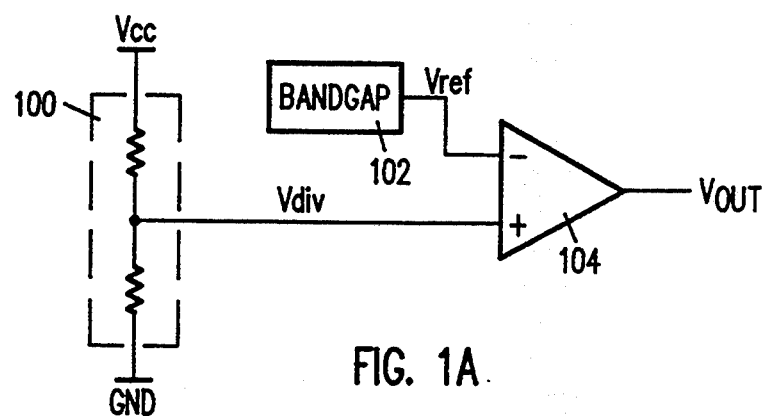
FIG. 1A is a simplified block diagram of the low voltage detect circuit of the present invention.

FIG. 1A illustrates the basic concept of the low voltage detect circuit of the present invention. A voltage divider 100 divides the voltage at the power supply terminal Vcc, and generates Vdiv. A reference voltage circuit 102 generates a stable reference voltage Vref. Reference voltage circuit 102 is a bandgap reference circuit with low temperature coefficient. A comparator 104 receives Vref and Vdiv at its negative and positive inputs, respectively. Comparator 104 compares the output of the reference circuit 102 (Vref) against a voltage divided Vcc (Vdiv), and when Vcc reaches a predetermined threshold, Vdiv will be greater than Vref. At this time the output of comparator 104, Vout, which is also the output of the low voltage detect circuit, will assert, signaling power-on and enabling the circuits it feeds.

Figure 2:
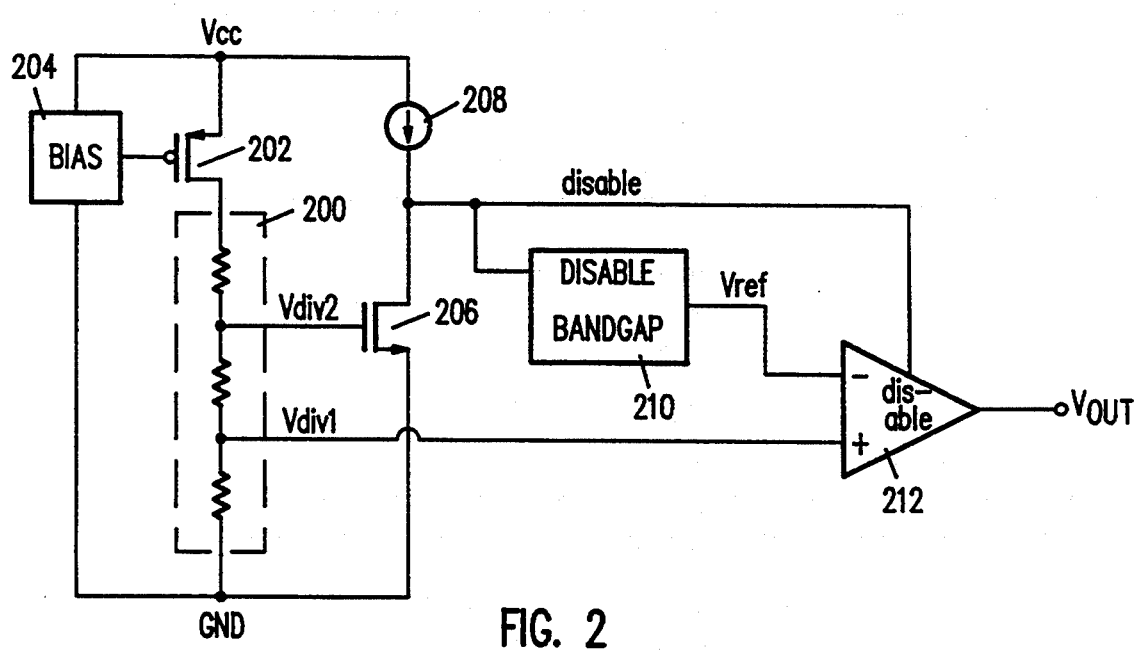
FIG. 2 is a block diagram of the low voltage detect circuit of the present invention including a circuit that ensures against faulty detection when power supply voltage is low.

Since the entire circuit, including voltage reference 102 and comparator 104, run off of Vcc, the output of comparator 104 (Vout) may not be reliable at low power supply voltages. FIG. 2 is the low voltage detect circuit of FIG. 1A with additional circuitry to ensure against faulty power-on detection at low Vcc. A voltage divider 200 connects to Vcc through a PMOS transistor switch 202. A biasing circuit 204 generates a bias voltage and applies it to a gate terminal of PMOS transistor 202. Biasing circuit 204 maybe, for example, a resistor voltage divider connected to Vcc, or a mirrored current source biasing circuit. Voltage divider 200 includes three resistors and therefore generates a divided Vcc at two different levels Vdiv1 and Vdiv2. Vdiv2 connects to an input (gate terminal) of an inverter transistor 206 that connects to Vcc through a current source load 208. Inverter transistor 206 generates a disable signal at it's output (or drain terminal). A specially designed bandgap reference circuit 210 with a disable input receives the disable signal at it's disable input. The disable signal also connects to a disable input of a comparator 212. The output of bandgap reference circuit 210 (Vref) and Vdiv1 connect to the negative and positive inputs of comparator 212, respectively. The output of comparator 212 is the output of the power-on circuit Vout.

The biasing circuit 204 and PMOS transistor 202 are designed such that when Vcc drops below a certain voltage, PMOS transistor 202 turns off. With PMOS transistor 202 turned off, voltage divider 200 effectively disconnects from Vcc, and therefore Vdiv1 and Vdiv2 drop to ground. The grounding of Vdiv2 turns off inverter transistor 206, which in turn allows current source load 208 to pull the disable signal to Vcc. The function of the disable input to bandgap reference circuit 210 is to pull Vref up to Vcc when the disable input is at Vcc. Therefore, at low enough Vcc, when the disable signal is at Vcc, Vref will also be high at Vcc. The positive input of comparator 212 is at ground (Vdiv1) while it's negative input is at Vcc (Vref). Therefore, the output of comparator 212 (Vout) turns low, indicating no power. The function of the disable input to comparator 212 is to assist in pulling down the comparator 212 output when the disable signal is high.

Figure 3:
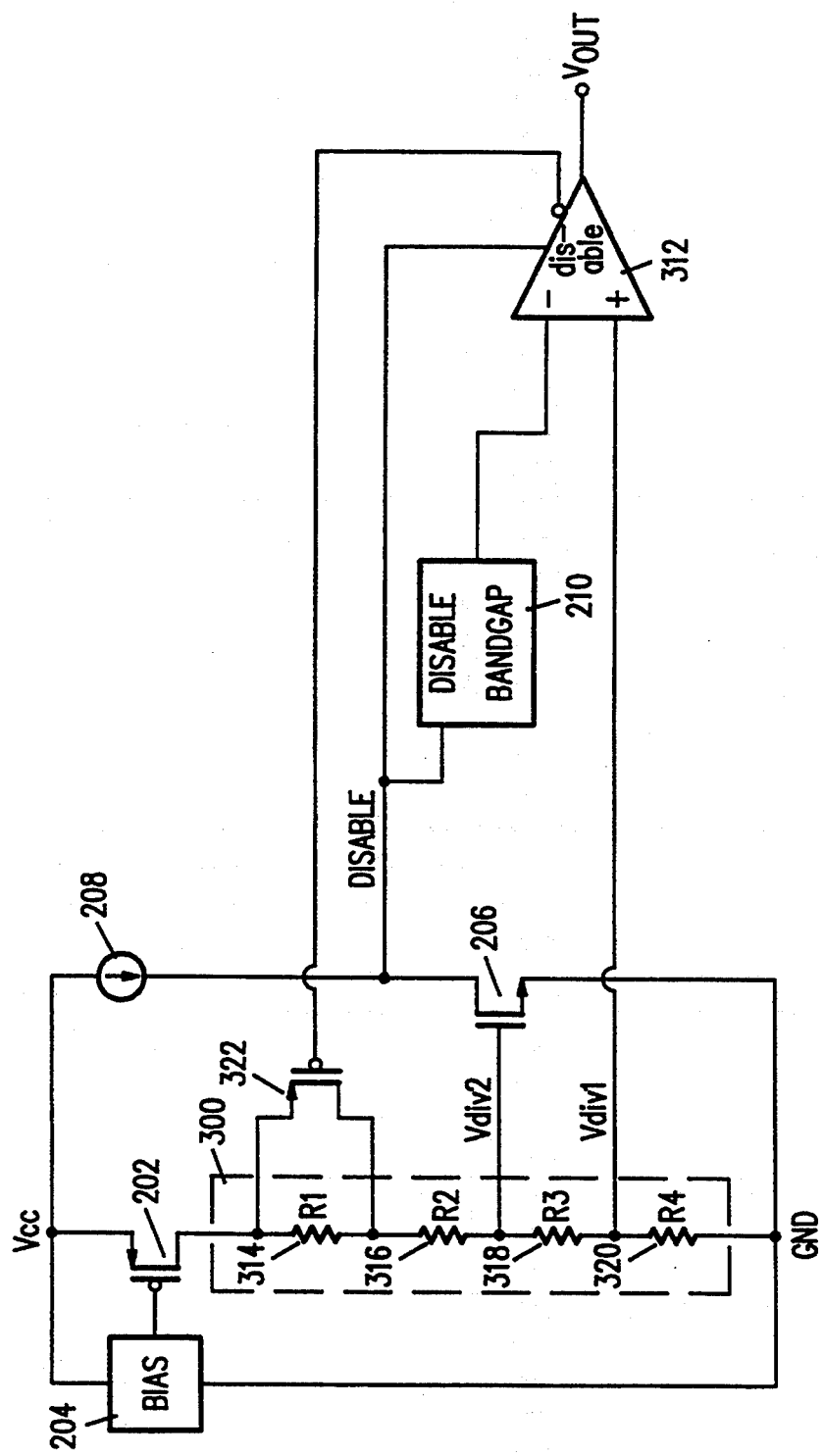
FIG. 3 shows the low voltage detect circuit of FIG. 2 with a hysteresis circuit.

To provide a stable power-on/power-off trip point, the circuit of FIG. 3 adds a hysteresis circuit to the low voltage detect circuit of FIG. 2. Voltage divider 300 includes four resistors R1 314, R2 316, R3 318, and R4 320. A PMOS transistor 322 connects across resistor R1 314. A comparator 312 provides a second output that is complementary to Vout. This complementary output connects to a gate terminal of PMOS transistor 322.

As long as Vout is low (i.e. no power) PMOS transistor 322 is off leaving Vdiv1 and Vdiv2 unchanged. When the voltage level at Vcc reaches the power-on level, Vout turns high and its complement turns low. This causes PMOS transistor 322 to turn on, shorting resistor R1 314. With resistor R1 314 shorted out, Vdiv1 and Vdiv2 raise in voltage by an amount equal to the ratio of sum of R1, R2, R3, and R4 to sum of R2, R3, and R4. Therefore:

power-on trip point = Vref × (R1+R2+R3+R4)/R4
power-off trip point = Vref × (R2+R3+R4)/R4
hysteresis = Vref × (R1/R4)

Figure 4:
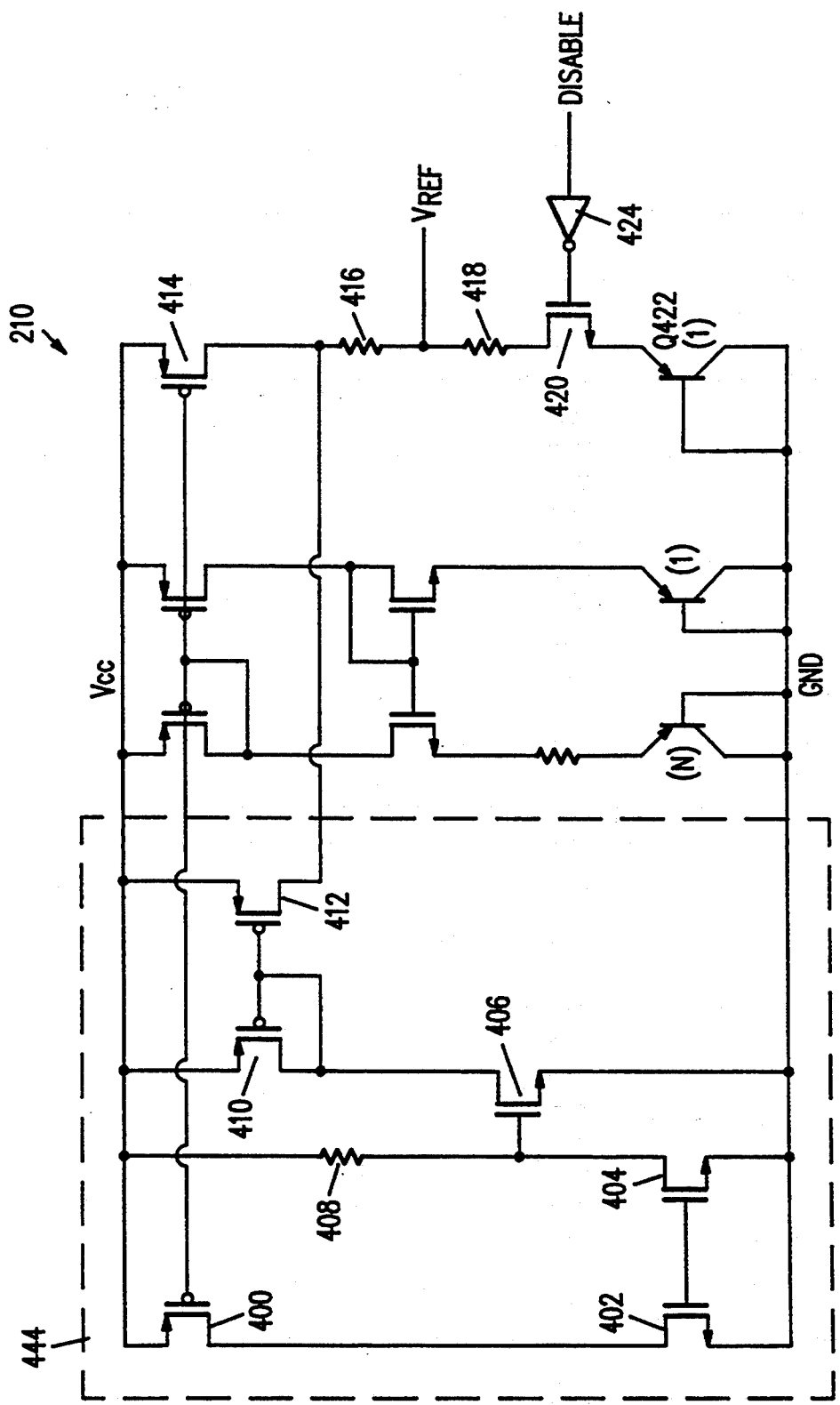
FIG. 4 is a circuit diagram of a bandgap reference circuit used in the low voltage detect circuit of FIG. 3.

FIG. 4 is a circuit diagram of bandgap reference circuit 210 of FIG. 3. This bandgap reference circuit includes a special disable circuit 444 that helps pull Vref up to Vcc when the DISABLE input is high. When DISABLE is high, NMOS transistor 420 turns off, disconnecting Vref from substrate bipolar transistor Q422 and ground. At the same time resistor 408 and transistors 406, 410 and 412 help PMOS transistor 414 to pull Vref up to Vcc, to ensure as high a voltage at Vref as possible when the DISABLE input is high.

Figure 5:
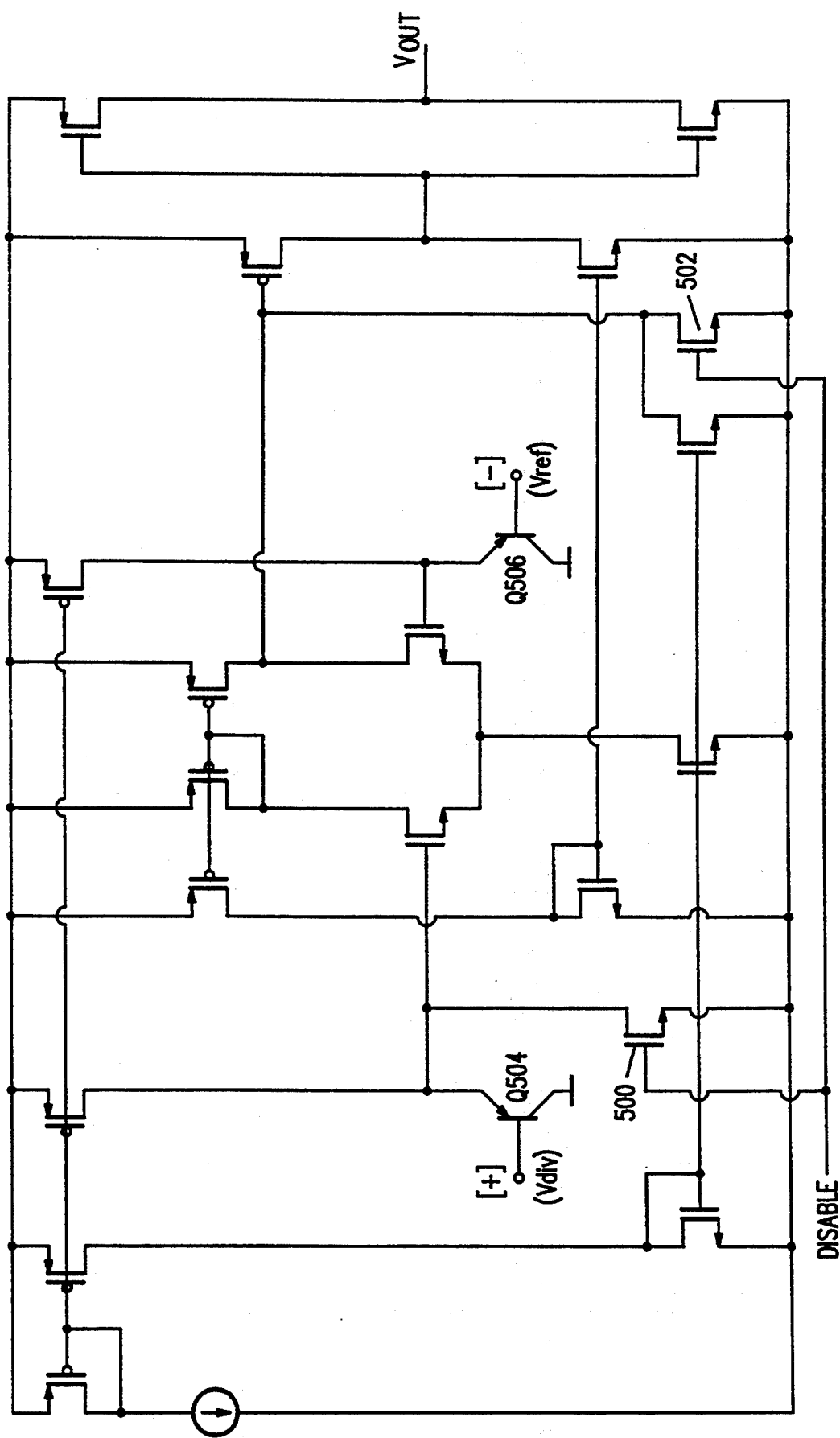
FIG. 5 is a circuit diagram of a comparator used in the low voltage detect circuit of FIG. 3.

FIG. 5 is a circuit diagram of comparator 312 with disable transistors 500 and 502. Comparator 312 is designed with substrate PNP bipolar transistors Q 504 and Q 506 at it's inputs. This allows comparator 312 to operate at lower input voltages since Vbe of a bipolar transistor could be as much as 0.5 volts lower than the Vt of an MOS transistor.

Figure 1B:
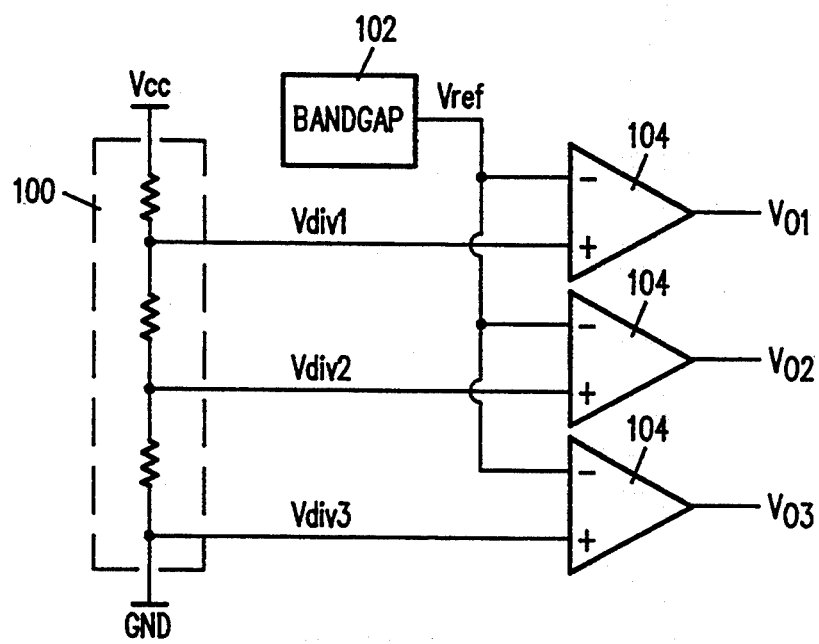
FIG. 1B is a block diagram of another embodiment of the present invention showing a multiple voltage detection scheme.

In conclusion, the present invention offers an accurate and stable low voltage detect circuit. While the above is a complete description of the preferred embodiment of the present invention, it is possible to use various alternatives, modifications and equivalents. For example, the resistor voltage divider 300 of FIG. 3 may generate a third voltage divided power supply to set a second trip point for a second comparator. This allows for a second reset signal (output of the second comparator) that turns on at a different power supply voltage as may be required by other parts of the circuitry. An exemplary circuit block diagram for this embodiment is shown in FIG. 1B. Therefore, the scope of the present invention should be determined not with reference to the above description but should, instead, be determined with reference to the appended claims, along with their full scope of equivalents.

What is claimed is:

1. A low voltage detect circuit for accurately detecting a turn-on voltage at a power supply terminal comprising:
   a bandgap voltage reference circuit coupled to the power supply terminal and having an output;
   a resistor voltage divider coupled to the power supply terminal, with a divided power supply voltage at an output; and
   a comparator, having an output coupled to the low voltage detect circuit output, a first input coupled to said bandgap voltage reference circuit output, and a second input coupled to said resistor voltage divider output,
   wherein, said comparator compares a voltage level at said first and second comparator inputs, and asserts an output of the low voltage detect circuit when said divided power supply voltage is greater than said reference voltage, indicating power-on.

2. A low voltage detect circuit for accurately detecting a turn-on voltage at a power supply terminal comprising:
   voltage reference circuit means, coupled to the power supply terminal, for generating a stable and constant reference voltage at an output;
   resistor voltage divider means, coupled to the power supply terminal through a transistor switch, for generating a divided power supply voltage at an output;
   biasing circuit means, coupled to the power supply terminal, for generating a bias voltage, and coupling said bias voltage to a control terminal of said transistor switch; and
   comparator means, having an output coupled to an output of the low voltage detect circuit, a first input coupled to said voltage reference circuit means output, and a second input coupled to said resistor voltage divider means output, said comparator means for comparing a voltage level at said first and second comparator inputs,
   wherein, for power supply voltage levels below a predetermined threshold, said transistor switch turns off, grounding said divided power supply voltage to force a low voltage level at the power-on circuit output, indicating no power.

3. A low voltage detect circuit for accurately detecting a turn-on voltage at a power supply terminal comprising:

voltage reference circuit means, coupled to the power supply terminal, and having a disable input, for generating a stable and constant reference voltage at an output;

resistor voltage divider means, coupled to the power supply terminal through a transistor switch, for generating a first and a second divided power supply voltage at a first and a second output, respectively;

biasing circuit means, coupled to the power supply terminal, for generating a bias voltage and coupling said bias voltage to a control terminal of said transistor switch;

an inverter transistor coupled to the power supply terminal through a current source load, having a control terminal coupled to said second divided power supply voltage, and an output coupled to said voltage reference circuit disable input; and a comparator having an output coupled to the low voltage detect circuit output, a disable input coupled to said inverter transistor output, a first input coupled to said reference voltage circuit means output, and a second input coupled to said first divided power supply voltage, wherein, for power supply voltage levels below a predetermined threshold, said transistor switch and said inverter transistor turn off, grounding said first and second divided power supply voltages, and disabling said comparator and said voltage reference circuit, to force a low voltage level at said comparator output, indicating no power.

4. A low voltage detect circuit for accurately detecting a turn-on voltage at a power supply terminal comprising:

voltage reference circuit means, coupled to the power supply terminal, for generating a stable and constant reference voltage at an output;

resistor voltage divider means, coupled to the power supply terminal through a first transistor switch, having a plurality of resistors for generating a divided power supply voltage at an output;

a second transistor switch, coupled across one of said plurality of resistors, having a control input;

biasing circuit means, coupled to the power supply terminal, for generating a bias voltage and coupling said bias voltage to a control terminal of said first transistor switch; and a comparator having a true output coupled to the low voltage detect circuit output, an inverted output coupled to said second transistor switch control input, a first input coupled to said reference voltage circuit means output, and a second input coupled to said divided power supply voltage, wherein, when said divided power supply voltage is higher than said reference voltage, said comparator output asserts indicating power-on, and said comparator inverted output turns on said second transistor switch, shorting said one resistor of said plurality of resistors, changing a voltage level at said divided power supply voltage to provide hysteresis.

5. A low voltage detect circuit for accurately detecting a turn-on voltage at a power supply terminal comprising:

voltage reference circuit means, coupled to the power supply terminal, and having a disable input, for generating a stable and constant reference voltage at an output;

resistor voltage divider means, coupled to the power supply terminal through a first transistor switch, having a plurality of resistors for generating a first and a second divided power supply voltage at a first and a second output, respectively;

second transistor switch, coupled across one of said plurality of resistors, having a control input;

biasing circuit means, coupled to the power supply terminal, for generating a bias voltage and coupling said bias voltage to a control terminal of said first transistor switch;

an inverter transistor coupled to the power supply terminal through a current source load, having a control terminal coupled to said second divided power supply voltage, and an output coupled to said voltage reference circuit disable input; and a comparator having a true output coupled to the low voltage detect circuit output, an inverted output coupled to said second transistor switch control input, a disable input coupled to said inverter transistor output, a first input coupled to said reference voltage circuit means output, and a second input coupled to said first divided power supply voltage, wherein, for power supply voltage levels below a predetermined threshold, said first transistor switch and said inverter transistor turn off, grounding said first and second divided power supply voltages, and disabling said comparator and said voltage reference circuit, to force a low voltage level at said comparator output, indicating no power.

6. A low voltage detect circuit for accurately detecting a turn-on voltage at a power supply terminal comprising:

a bandgap circuit, coupled to the power supply terminal, for generating a stable and constant reference voltage at an output;

voltage divider means, coupled between the power supply terminal and a ground terminal, for generating a plurality of divided power supply voltages at a plurality of outputs; and plurality of comparator means, each having a first input coupled to said bandgap circuit output, and a second input coupled to a corresponding one of said plurality of voltage divider means outputs, each of said plurality of comparator means for comparing a voltage level at said first and second inputs, and asserting a reset output when said corresponding divided power supply voltage is greater than said reference voltage.

7. The low voltage detect circuit of claim 6, wherein said voltage divider means comprises a plurality of resistors, and further comprising a plurality of transistor switches coupled across a corresponding plurality of said plurality of resistors, said plurality of switch transistors having a corresponding plurality of control terminals coupled to a complementary output of each of said plurality of comparators means, respectively.

8. A low voltage detect circuit for accurately detecting a turn-on voltage at a power supply terminal comprising:

a bandgap circuit, coupled to the power supply terminal, for generating a stable and constant reference voltage at an output;

voltage divider means, coupled between the power supply terminal and a ground terminal, for generating a divided power supply voltage at an output; and comparator means, having a first input coupled to said bandgap circuit output, and a second input coupled to said voltage divider means output, for comparing a voltage level at said first and second inputs, and asserting an output of the low voltage detect circuit when said divided power supply voltage is greater than said reference voltage, indicating power-on.

9. The low voltage detect circuit of claim 8, further comprising:

a first transistor switch coupled between the power supply terminal and said resistor voltage divider means; and biasing means, coupled to the power supply terminal, and having an output coupled to a control terminal of said first transistor switch, for turning off said first transistor switch when a voltage level at the power supply terminal drops below a predetermined value.

10. The low voltage detect circuit of claim 9, wherein said voltage divider means comprises a plurality of resistors, and further comprising a second transistor switch coupled across one of said plurality of resistors, said second transistor switch having a control terminal coupled to a complementary output of said comparator means.

11. The low voltage detect circuit of claim 10 further comprising:

an inverter transistor with an output coupled to a disable input of said voltage reference circuit means and a disable input of said comparator means, and an input coupled to a second output of said voltage divider means; and a current source load coupling said inverter transistor to the power supply terminal.

* * * * *